(12) United States Patent
Sharma et al.

(10) Patent No.: US 8,227,820 B2
(45) Date of Patent: Jul. 24, 2012

(54) SEMICONDUCTOR LIGHT-EMITTING DEVICE

(75) Inventors: Rajat Sharma, Goleta, CA (US); Paul Morgan Pattison, Santa Barbara, CA (US); John Francis Kaeding, Goleta, CA (US); Shuji Nakamura, Santa Barbaa, CA (US)

(73) Assignee: The Regents of the University of California, Oakland, CA (US)

( * ) Notice: Subject to any disclaimer, the term of this patent is extended or adjusted under 35 U.S.C. 154(b) by 430 days.

(21) Appl. No.: 11/054,271

(22) Filed: Feb. 9, 2005

(65) Prior Publication Data

US 2006/0175624 A1 Aug. 10, 2006

(51) Int. Cl.
*H01L 33/00* (2010.01)
(52) U.S. Cl. ............ 257/95; 257/89; 257/90; 257/103; 257/E33.034; 257/E33.028; 438/42; 438/47
(58) Field of Classification Search ............ 257/95
See application file for complete search history.

(56) References Cited

U.S. PATENT DOCUMENTS

| | | |
|---|---|---|
| 3,739,217 A | 6/1973 | Bergh et al. |
| 5,226,053 A | 7/1993 | Cho et al. |
| 5,362,977 A | 11/1994 | Hunt et al. |
| 5,779,924 A | 7/1998 | Krames et al. |
| 6,155,699 A | 12/2000 | Miller et al. |
| 6,163,038 A | 12/2000 | Chen et al. |
| 6,303,404 B1 | 10/2001 | Moon et al. |
| 6,316,785 B1 * | 11/2001 | Nunoue et al. ............ 257/14 |
| 6,357,889 B1 | 3/2002 | Duggal et al. |
| 6,504,180 B1 | 1/2003 | Heremans et al. |
| 6,525,464 B1 | 2/2003 | Chin |
| 6,538,371 B1 | 3/2003 | Duggal et al. |
| 6,576,932 B2 * | 6/2003 | Khare et al. ............ 257/103 |
| 6,608,330 B1 | 8/2003 | Yamada |
| 6,620,238 B2 | 9/2003 | Tsuda et al. |
| 6,620,643 B1 | 9/2003 | Koike |
| 6,630,691 B1 | 10/2003 | Mueller-Mach et al. |
| 6,657,236 B1 * | 12/2003 | Thibeault et al. ............ 257/98 |
| 6,746,295 B2 | 6/2004 | Sorg |
| 7,098,589 B2 | 8/2006 | Erchak et al. |
| 2002/0014681 A1 | 2/2002 | Tsuda et al. |
| 2002/0145148 A1 | 10/2002 | Okuyama et al. |
| 2003/0057444 A1 | 3/2003 | Niki et al. |
| 2003/0178626 A1 | 9/2003 | Sugiyama et al. |
| 2004/0056261 A1 | 3/2004 | Tsuda et al. |
| 2004/0104398 A1 * | 6/2004 | Hon et al. ............ 257/98 |
| 2004/0211970 A1 | 10/2004 | Hayashimoto et al. |
| 2005/0001227 A1 | 1/2005 | Niki et al. |

(Continued)

FOREIGN PATENT DOCUMENTS

EP 1081771 A2 3/2001

(Continued)

OTHER PUBLICATIONS

Zhang et al. Japanese Journal of Applied Physics vol. 40 (2001) pp. L921-L924.*

(Continued)

*Primary Examiner* — Jerome Jackson, Jr.
(74) *Attorney, Agent, or Firm* — Gates & Cooper LLP

(57) ABSTRACT

A semiconductor light-emitting diode, and method of fabricating same, wherein an indium (In)-containing light-emitting layer, as well as subsequent device layers, is deposited on a textured surface. The resulting device is a phosphor-free white light source.

27 Claims, 8 Drawing Sheets

U.S. PATENT DOCUMENTS

2005/0092980 A1* 5/2005 Chen et al. ............... 257/14
2005/0156510 A1  7/2005 Chua et al.
2005/0205884 A1  9/2005 Kim et al.
2006/0202226 A1  9/2006 Weisbuch et al.

FOREIGN PATENT DOCUMENTS

WO  WO 2005/064666  7/2005
WO  2005083037 A1  9/2005

OTHER PUBLICATIONS

International Search Report mailed Nov. 1, 2007.
EP Office Action dated Mar. 14, 2011 (EP Application No. 06734501.7).
Supplementary European Search Report for EP Application No. 06734501.7, Mar. 2, 2010.
CN Office Action issued Nov. 24, 2011, Application No. 200680004323.1.
H. Benisty et al., "Impact of planar micro-cavity effects on light extraction—basic concepts and analytical trends," 1998, IEEE J. Quantum Electron, 34:1612.
M. Boroditsky et al., "Light-Emitting Diode Extraction Efficiency," 1997, Proceedings of the SPIE—The International Society for Optical Engineering, SPIE—Int. Soc. Opt. Eng., 3002:119-122.
D. Delbeke et al., "High-efficiency Semiconductor Resonant-Cavity Light-Emitting diodes: A review," 2002, IEEE J. on selected topic in Quantum Electron, 8(2):189.
X. Guo et al., "Phonton Recycling Semiconductor Light Emitting diode," 1999, IEDM Technical Digest, IEDM-99, p. 600.
I. Schnitzer et al., "30% External Quantum Efficiency From Surface Textured, Thin Film Light Emitting Diode," 1993, Applied Physics Letters, 63:2174-2176.
Y. Kawakami et al., "Dimensionality of Excitons in InGaN-Based Light Emitting Devices", Phys. Stat. Sol. (a) 178, 331 (2000).
Y Ohba et al., "A study on strong memory effects for Mg doping in GaN metalorganic chemical vapor deposition", Journal of Crystal Growth 145 pp. 214-218 (1994).
Chen-Fu Chu et al., "Comparison of p-Side Down and p-Side Up GaN Light-Emitting Diodes Fabricated by Laser Life-Off", Jpn. J. Appl. Phys. vol. 42, Feb. 15, 2003.
P.R. Tavernier et al., "Mechanics of laser-assisted debonding of films",Journal of Applied Physics, vol. 89 No. 3 (Feb. 1, 2001).
W.S. Wong et al., "Fabrication of thin-film InGaN light-emitting diode membranes by laser lift-off", Applied Physics Letters, vol. 75 No. 10 (Sep. 6, 1999).
X.A. Cao et al., "Electrical effects of plasma damage in p-GaN", Applied Physics Letters, vol. 75 No. 17 (Oct. 25, 1999).
Toshio Nishida et al., "Efficient and high-power AlGaN-based ultraviolet light-emitting diode grown on bulk GaN", Applied Physics Letters, vol. 79 No. 6 (Aug. 6, 2001).
A. Billeb et al., "Microcavity effects in GaN epitaxial films and in Ag/GaN/sapphire structures", Appl. Phys. Lett. 70 (21) (May 26, 1997).
W.S. Wong et al., "$In_xGa_{1-x}N$ light emitting diodes on Si substrates fabricated by Pd-In metal bonding and laser lift-off", Appl. Phys. Lett. vol. 77 No. 18 (Oct. 30, 2000).
J.J. Wierer et al., "High-power AlGaInN flip-chip light-emitting diodes", Applied Physics Letters, vol. 78 No. 22 (May 28, 2001).
M.S. Minsky et al., "Room-temperature photoenhanced wet etching of GaN", Appl. Phys. Lett 68 (11) (Mar. 11, 1996).
C. Youtsey et al., "Gallium nitride whiskers formed by selective photoenhanced wet etching of dislocations", Applied Physics Letters, vol. 73 No. 6 (Aug. 10, 1998).
Zhang, J.P. et al., "Quaternary AlInGaN Multiple Quantum Wells for Ultraviolet Light Emitting Diodes," Jpn. J. Appl. Phys. (2001), pp. L921-L924, vol. 40, Part 2, No. 9A/B.

* cited by examiner

SEMICONDUCTOR LIGHT-EMITTING DEVICE

CROSS-REFERENCE TO RELATED APPLICATIONS

This application is related to the following co-pending and commonly-assigned applications:

U.S. Utility application Ser. No. 10/938,704, filed Sep. 10, 2004, now U.S. Pat. No. 7,223,998, issued on May 29, 2007, by Carole Schwach, Claude C. A. Weisbuch, Steven P. DenBaars, Henri Benisty, and Shuji Nakamura, entitled "WHITE, SINGLE OR MULTI-COLOR LIGHT EMITTING DIODES BY RECYCLING GUIDED MODES," and P.C.T. International Application Serial No. US03/39211, filed Dec. 9, 2003, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING,"

which applications are incorporated by reference herein.

STATEMENT REGARDING SPONSORED RESEARCH AND DEVELOPMENT

The present invention was made under support from the University of California, Santa Barbara Solid State Lighting and Display Center member companies, including Stanley Electric Co., Ltd., Mitsubishi Chemical Corp., Rohm Co., Ltd., Cree, Inc., Matsushita Electric Works, Matsushita Electric Industrial Co., and Seoul Semiconductor Co., Ltd.

BACKGROUND OF THE INVENTION

1. Field of the Invention

This invention is related to semiconductor light emitting devices.

2. Description of the Related Art

Typical incandescent light sources, while highly energy-inefficient, have a desirable characteristic broad-emission spectrum and a high color-rendering index. In order to mimic these latter attributes in gallium nitride (GaN) based devices, typical current state-of-the-art designs employ indium (In) containing "active" layers that emit light in the near-ultraviolet (UV) to blue region of the spectrum, which is then used to excite phosphor layers to produce the desired broad-spectrum emission.

This approach has certain disadvantages. The process of down-conversion is inherently inefficient due to the Stokes shift (a difference in transition energy of the emission and absorption spectra resulting from defects in the material and, in general, partial non-radiative decay) and poor conversion efficiency. The emission spectrum and intensity are highly sensitive to spatial variations in the phosphor composition and thickness, and may vary greatly with emission direction. Finally, while the diode itself may have a long lifetime, phosphors typically degrade with time, resulting in a variation of the emission spectrum with time.

Nitride-based alloys containing indium can show characteristic emission in a wavelength range from the UV to the infrared part of the spectrum. Thus, in theory, indium-containing alloys may alone be used to produce light sources that emit over this broad spectral range, without the aid of phosphors.

However, using indium-containing alloys to obtain long wavelength emission (blue to infrared) has its own problems; primary among them is that depositing layers with a high indium content causes significant degradation of the material quality, which is detrimental to device functioning and performance. Thus, it is currently not possible to make very efficient nitride-based green, yellow or red light emitting diodes (LEDs), as well as lasers. Further, current designs proposing methods to obtain "white" light without the aid of phosphors typically rely on a high-indium content layer deposited under conditions that result in poor material quality.

The present invention described herein seeks to address the two broad issues discussed above. First, surface texturing allows an indium-containing layer emitting at a specific wavelength to be deposited under conditions that promote improved material quality and higher efficiency. Second, by suitable choice of parameters such as the ratio of textured to non-textured area and control of the texture pattern and dimensions, as well as a suitable choice of epitaxial growth conditions, this invention may be used to obtain strong light emission at two or more peak wavelengths from different areas of the same device. Selective texturing of the surface may thus be used to produce a phosphor-free "white" light source, wherein the indium-containing light-emitting layer is deposited under conditions that do not compromise the material quality.

SUMMARY OF THE INVENTION

The invention discloses a semiconductor light emitting device, and method of fabricating same, wherein an indium-containing light-emitting layer, as well as subsequent device layers, is deposited on a textured surface. The resulting device is a phosphor-free white light source. Specifically, multi-wavelength light emission is obtained from the textured semiconductor structure.

The present invention deposits, or re-grows, a semiconductor material layer of identical material composition on top of the textured semiconductor layer. Specifically, the method of fabrication includes the steps of: (1) depositing a nucleation layer of GaN on a substrate; (2) depositing an unintentionally-doped (UID) GaN (GaN:UID) template layer on the nucleation layer; (3) depositing an n-type conductive GaN layer on the GaN:UID template layer; (4) etching the deposited GaN layers to create the textured surface; (5) re-growing the n-type conductive GaN layer on the textured surface; and (6) depositing the indium-containing light-emitting layer on the re-grown n-type conductive GaN layer.

The step of depositing the indium-containing light-emitting layer on the re-grown n-type conductive GaN layer further comprises: (i) depositing a quantum well layer of (Al, In, Ga)N on the re-grown n-type conductive GaN layer; and (ii) depositing a barrier layer of (Al, In, Ga)N on the quantum well layer of (Al, In, Ga)N. These depositing steps (i) and (ii) are repeated to obtain a plurality of quantum well and barrier layers. Moreover, varying fractions of indium may be incorporated into the (Al, In, Ga)N layers, depending on a position on the textured surface.

The step of etching the deposited GaN layers to create the textured surface represents the selective texturing of the surface. Consequently, the textured surface may be a partially textured surface, including both textured areas and non-textured areas. The method of fabrication includes steps for controlling a ratio of a textured area of the surface to a non-textured area of the surface, controlling the textured surface's pattern and controlling the textured surface's dimensions. The different patterns and depths of the textured surface produce different emission results.

BRIEF DESCRIPTION OF THE DRAWINGS

Referring now to the drawings in which like reference numbers represent corresponding parts throughout.

DETAILED DESCRIPTION OF THE INVENTION

Figure 1:
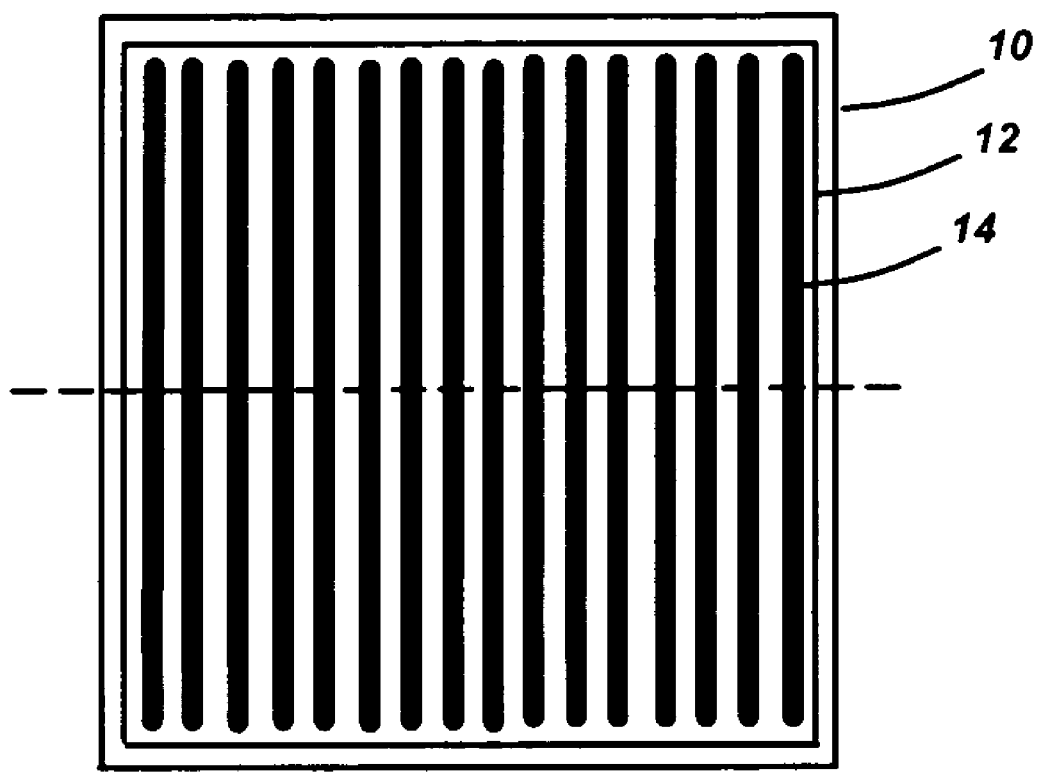
FIG. 1 shows a plan-view schematic of a representative device surface area after surface texturing has been performed.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

GaN-based light emitting diodes hold the promise of revolutionizing the lighting industry, thanks to their high efficiency and versatility. Similarly, GaN-based laser diodes have already had a significant impact on high-density data storage. Current state-of-the-art GaN-based semiconductor light emitting devices typically comprise an "active" region with a single-quantum-well or multiple-quantum-well structure emitting blue or near-UV light. This light may be used to excite a phosphor or combination of phosphors to produce secondary emission in the green/red/yellow range of the color spectrum, as in a "white" light emitting diode. Or, through suitable design of the device structure, laser emission may be obtained from these devices.

The purpose of the present invention is to develop efficient light-emitting devices emitting from the UV to the infrared part of the spectrum, that incorporate an indium-containing light-emitting layer deposited on a textured surface. Depositing the light-emitting layer in this manner produces a shift in the peak emission wavelength towards longer wavelengths in the textured area (compared to emission from the non-textured area), and also a broadening of the emission spectrum. This effect may be used to produce devices with higher material quality and improved performance, as will be described below. Such an indium-containing layer deposited on a textured surface may be used as either an "active" layer (i.e., a layer that is electrically active and emits light upon carrier injection) or as one or more "passive" layers (akin to phosphor layers). Further, this result may be tailored to produce a "white" light source, as will also be described below.

The present invention describes a method for producing a semiconductor light-emitting device by epitaxial growth and subsequent nanofabrication, wherein the indium-containing light-emitting layer and subsequent device layers are deposited on a partially textured surface. A significant shift in the peak emission wavelength (towards longer wavelengths) is observed in the textured area, when compared to emission from the non-textured area (a secondary effect is the broadening of the emission spectrum in the textured area). This effect may be used to achieve high-brightness light emitters emitting from the UV to the infrared part of the spectrum (i.e., spanning the entire visible part of the spectrum). Further, by suitable design of the texture pattern and depth, as well as control of the ratio of textured to non-textured areas over the device area, emissions may be produced at two or more wavelengths from a single device, thereby enabling "white" light to be produced without the use of phosphors. Since this is achieved without compromising the material quality, ohmic contacts are feasible, and may be placed in a non-textured area of the textured surface. A secondary advantage is that the textured surface aids in the extraction of more light from the device, thereby improving extraction efficiency.

Technical Description

This invention describes a method for producing a semiconductor light-emitting device incorporating indium-containing alloys, where the indium-containing light-emitting layer, as well as subsequent device layers, are deposited on a textured surface. The epitaxial layers are typically deposited on a (0001) sapphire substrate. However, other substrate materials or crystal orientations may also be used to achieve these results. The epitaxial growth described herein is carried out using the technique of Metal Organic Chemical Vapor Deposition (MOCVD). Other epitaxial growth techniques, such as Molecular Beam Epitaxy (MBE), may also be employed to achieve the same objectives. A dry etching technique is used to produce the desired texturing of part of the growth surface prior to the re-growth of the light-emitting layer. Additionally, other techniques may be used to produce the desired surface texture. A specific texture pattern and depth are described in the preferred embodiment below. However, a range of values for these parameters may be used.

Figure 2:
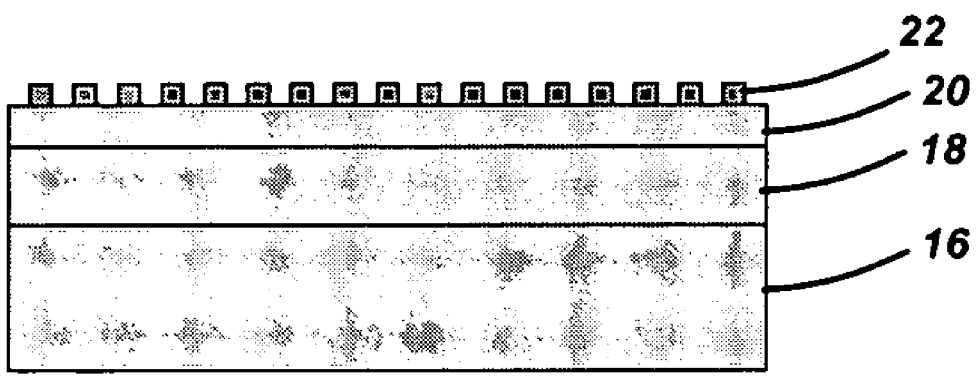
FIG. 2 shows a cross section of the area of FIG. 1.
Figure 3A:
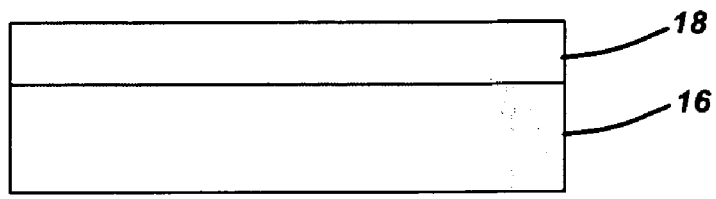
FIGS. 3(a)-(d) show schematically the sequence of steps involved in obtaining the texturing of the device surface area.
Figure 3B:
Figure 3C:
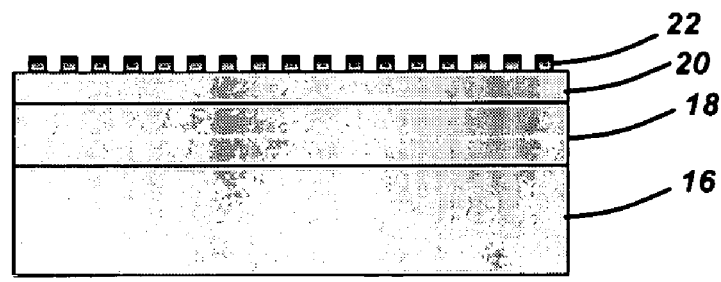
Figure 3D:
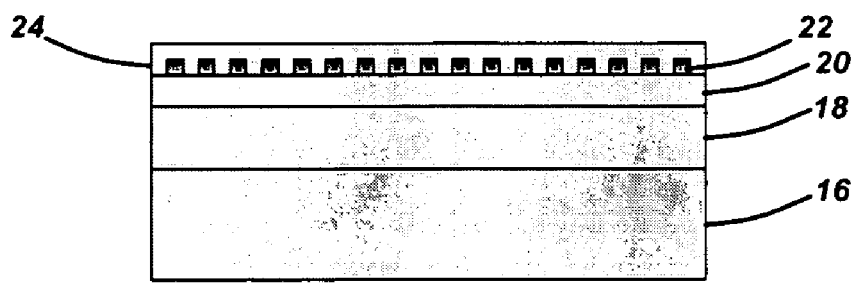
Figure 4A:
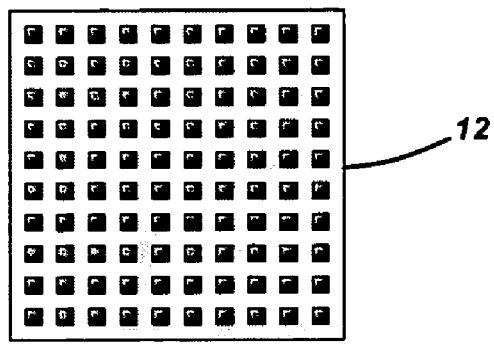
FIGS. 4(a)-(c) shows some other possible texture patterns that may be applied in place of the one depicted in FIG. 1.
Figure 4B:
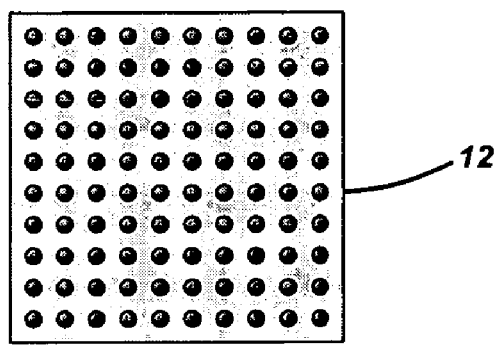
Figure 4C:
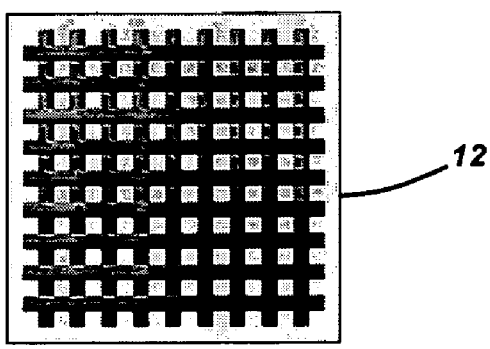
Figure 5A:
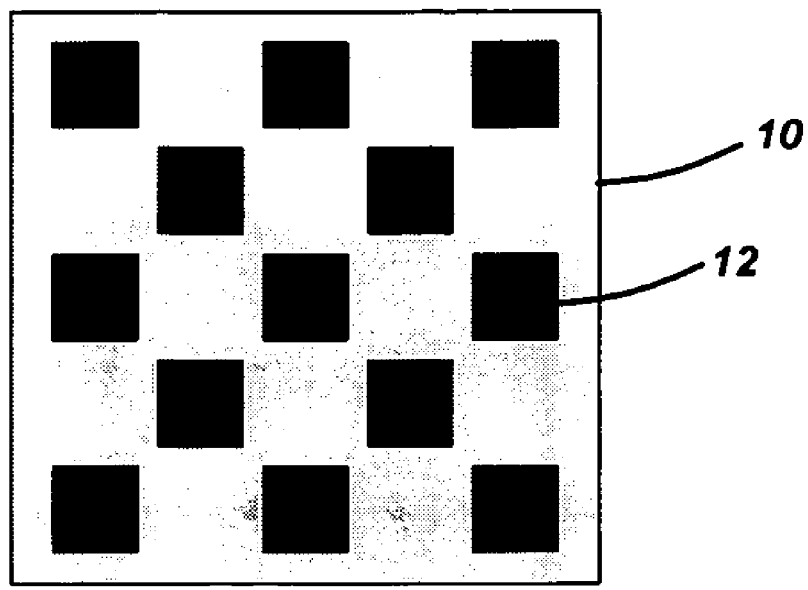
FIGS. 5(a) and (b) shows some other possible variations for the textured and non-textured areas.

FIG. 1 shows a plan-view schematic of a representative device surface area after surface texturing has been performed, including the device area 10, textured area 12 and surface feature 14. FIG. 2 shows a cross section of the same area, wherein the different layers are detailed, including a sapphire substrate 16, GaN layer 18, patterned or textured n-GaN layer 20 and n-GaN surface feature 22. FIGS. 3(a)-(d) show schematically the sequence of steps involved in obtaining the result described herein, wherein FIG. 3(a) shows a sapphire substrate 16 and GaN layer 18, FIG. 3(b) shows a sapphire substrate 16, GaN layer 18 and n-GaN layer 20, FIG. 3(c) shows a sapphire substrate 16, GaN layer 18, a textured n-GaN layer 20 and an n-GaN surface 22, and FIG. 3(d) shows a sapphire substrate 16, GaN layer 18, a textured n-GaN layer 20, an n-GaN surface 22 and re-grown layer 24. FIGS. 4(a)-(c) shows some other possible patterns for the textured area 12 that may be applied in place of the textured area 12 depicted in FIG. 1. FIGS. 5(a) and (b) shows some other possible variations for the device area 10 and textured areas 12. It should be noted that a critical element of this invention is the deposition of the light-emitting layer on a textured surface.

Process Steps

Figure 6:
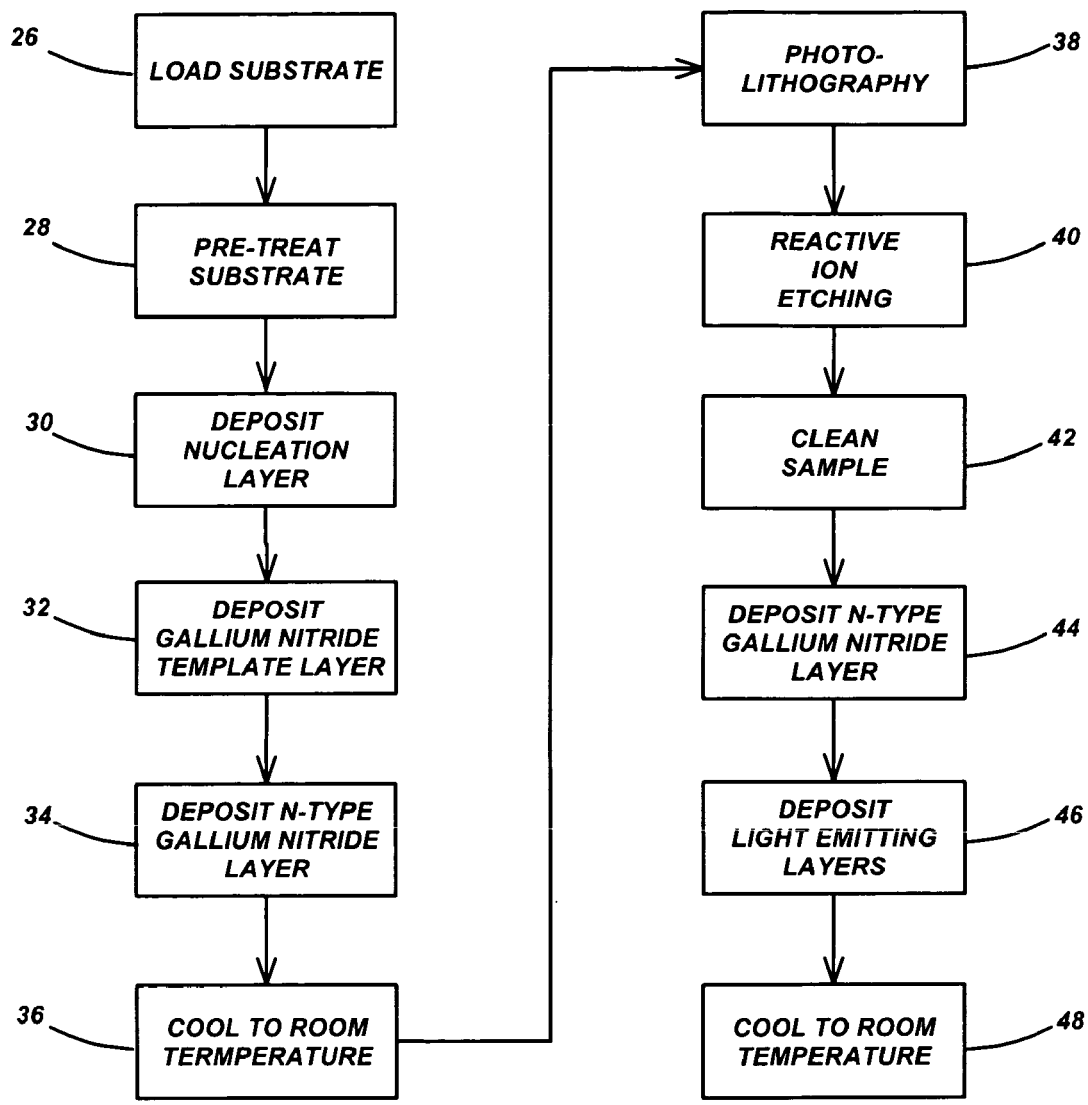
FIG. 6 is a flowchart illustrating a typical growth and fabrication sequence that yields the light-emitting device according to the preferred embodiment of the present invention.

FIG. 6 is a flowchart illustrating a typical growth and fabrication sequence that yields the light-emitting device according to the preferred embodiment of the present invention. It should be noted that temperatures, gas flow rates and step times are specific to the reactor used, and if and where provided, are only meant to serve as a reference. Other temperatures, gas flow rates and step times may be used without departing from the scope of the present invention.

1. In Block 26, a c-plane sapphire substrate is loaded into the MOCVD reactor through an antechamber that is evacuated and backfilled with nitrogen gas in order to prevent oxygen from entering the reactor chamber.

2. In Block 28, a mixture of hydrogen ($H_2$) and nitrogen ($N_2$) gas is flowed through the reactor chamber, and the heater temperature is raised to an estimated wafer surface temperature of ~1075° C. (measured thermocouple temperature of 925° C.), where it is held for a duration of roughly 10 minutes, in order to "pre-treat" the sapphire substrate.

3. In Block 30, the temperature is lowered to an estimated wafer surface temperature of ~570° C. (measured thermocouple temperature of 470° C.), and ammonia ($NH_3$) gas is introduced into the reactor chamber, in addition to hydrogen and nitrogen gases. Once the temperature is stable, a small flow of tri-methyl gallium (TMG) is injected into the reactor chamber, and a thin, mostly amorphous "nucleation" layer of GaN is deposited on the substrate.

4. In Block 32, the flow of TMG is stopped, and the temperature is raised at a controlled rate to an estimated wafer surface temperature of 1050° C. (measured thermocouple temperature of 900° C.). Once the temperature stabilizes, the flow of TMG is resumed. The growth of a GaN:UID template layer thus begins, and is continued until approximately 1.5 microns of GaN have been deposited onto the substrate.

5. At this point, in Block 34, a small flow of silane gas ($SiH_4$) is introduced into the gas stream injected into the reactor, to obtain n-type conductive GaN. The growth is continued until a 1 micron thick n-type conductive GaN layer is deposited on the template layer.

6. In Block 36, the flow of TMG and $SiH_4$ is terminated to stop the deposition, and the temperature is lowered to room temperature. The flow of $NH_3$ is continued during the cool-down, in order to prevent degradation of the deposited GaN film. The sample is then removed from the reactor.

7. In Block 38, a suitable photoresist is spun onto the sample after appropriate surface preparation, and the desired pattern is then transferred onto the photoresist using a suitable photolithography tool, using a mask designed for this specific purpose. A suitable developer is then used to develop the photoresist, and this is followed by a hard-bake. The sample is then "descummed" using an oxygen plasma.

8. In Block 40, the sample is introduced into the Reactive Ion Etching (RIE) tool. Chlorine gas is used as the etchant. The area of the deposited GaN layers that is not protected by the photoresist mask is etched under these conditions to create the textured surface. In areas protected by photoresist, the photoresist is etched at a relatively slower rate. The etch is carried out for a suitable duration so as to obtain an etch depth of roughly 500 nm into the GaN film. Previously established etch rates are used to determine this duration.

Consequently, this Block represents selectively texturing the surface, wherein the selectively textured surface results in a phosphor-free white light source. Note that the textured surface may be a partially textured surface, and this Block, in conjunction with Block 38, may entail controlling a ratio of a textured area of the surface to a non-textured area of the surface, controlling the textured surface's pattern and controlling the textured surface's dimensions.

9. In Block 42, the sample is removed from the RIE tool, and suitable solvents are used to remove the remaining photoresist. A profilometer is used to confirm that the etch profile of the GaN film obtained is as desired. The sample is then cleaned using solvents and prepared for re-introduction into the MOCVD reactor.

10. In Block 44, the sample is then re-introduced into the MOCVD reactor. The temperature is raised to the estimated wafer surface temperature of 1050° C., while a mixture consisting of $NH_3$, $N_2$ and $H_2$ gases is flowed. When the temperature stabilizes, appropriate volumes of TMG and $SiH_4$ are introduced into the gas stream, and roughly 100 nm of an n-type conductive GaN layer is re-grown on the textured surface.

11. In Block 46, the flow of TMG, $SiH_4$ and $H_2$ is then stopped, and the temperature is lowered to an estimated wafer surface temperature of 800° C. (measured thermocouple temperature of 675° C.). The indium-containing light-emitting layer is then deposited on the re-grown n-type conductive GaN layer at this temperature. First, a 4 nm-thick "quantum well" layer of (In, Ga)N is deposited on the re-grown n-type conductive GaN layer, followed by the deposition of a 8 nm-thick "barrier" layer of GaN on the quantum well layer. These two depositing steps are repeated (e.g., four more times) so as to obtain a plurality (e.g., 5) of quantum well and barrier layers. Suitable flows of tri-ethyl gallium (TEG) and tri-methyl indium (TMI) are flowed during the deposition of the (In, Ga)N well layer, while only TEG is flowed during the deposition of the GaN layer.

Varying fractions of indium are incorporated into the (In, Ga)N layers, depending on the position on the patterned substrate. For instance, it may be expected to see a higher incorporation of indium at the top of a pillar, and lower incorporation of indium in a valley between pillars. An intermediate degree of incorporation may be expected for the film deposited on side-walls of the pillars. This spatial variation in the incorporation of indium in the (In, Ga)N film is key to the success of this invention. Further, different texture patterns and depths may be expected to produce different emission results, including a different shift in the peak emission wavelength, as well as different emission intensities.

12. In Block 48, the flows of all metalorganics are then stopped, and the sample is brought back to room temperature, while continuing to flow $NH_3$ gas, to prevent deterioration of the deposited film.

Figure 7:
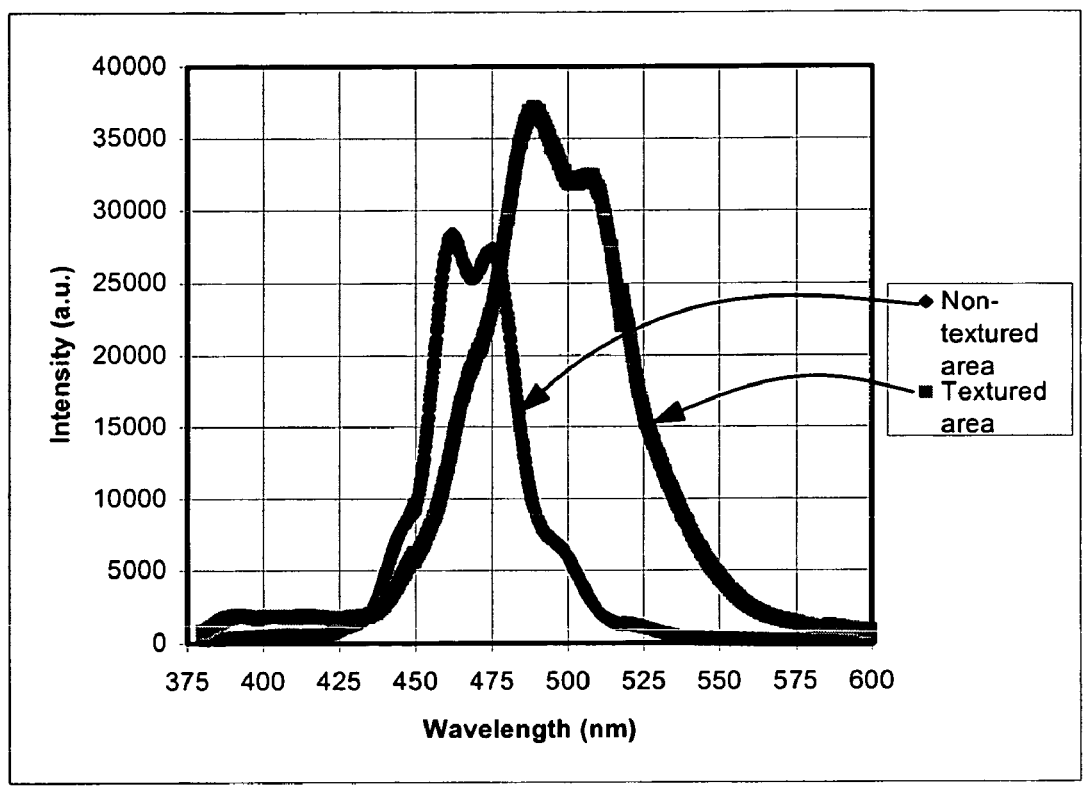
FIG. 7 is a graph illustrating the results of photoluminescence measurements carried out on a textured area, and then on an adjacent non-textured area.
Figure 8:
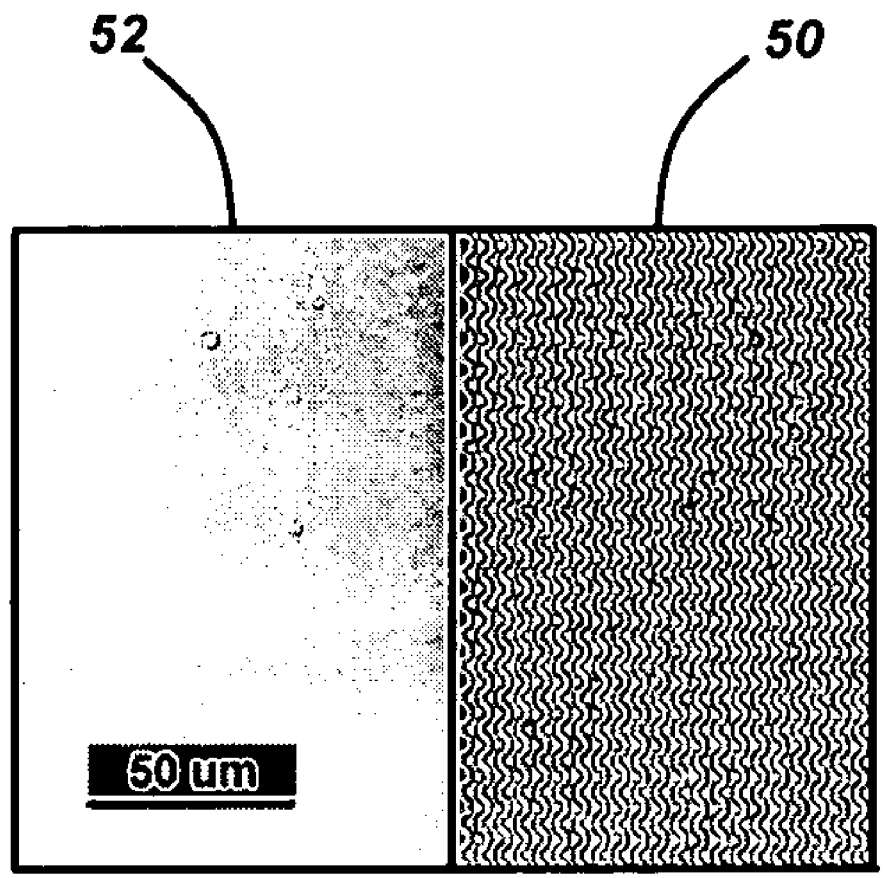
FIG. 8 is a plan-view optical micrograph showing a textured area and an adjacent non-textured area for reference.

Photoluminescence measurements were performed using a setup that produces a suitably small beam spot size (on the order of 50 microns in diameter). The measurement was carried out on a textured area, and then on an adjacent non-textured area. The emission was measured in a suitably broad spectral range, e.g., from 350 to 700 nm. A sample spectrum from each of these areas is shown in FIG. 7, validating the central premise of this invention, i.e., that by re-growing the light-emitting layer on a suitably textured growth surface, a large shift may be produced in the peak emission wavelength towards longer wavelengths on a suitably small spatial scale, without compromising the emission intensity, as evidenced by the photoluminescence spectra. FIG. 8 is a plan-view optical micrograph, showing a textured area 50, and an adjacent non-textured area 52 for reference.

Possible Modifications and Variations

Several modifications and variations that incorporate the essential elements of the present invention are described below. Additionally, several alternative materials, growth conditions and techniques may be used in the practice of this invention, as shall be enumerated below.

1. The indium-containing light-emitting layer deposited on a textured surface may be incorporated as either an "active" element or as one or more "passive" elements in a semiconductor device. By "active" layer, what is meant is a layer that is electrically active, and emits light as a result of carrier injection. By "passive" layer, what is meant is a layer that is electrically passive, and emits light as a result of excitation due to light from the active layer, in a manner akin to a phosphor.

2. It may be possible to incorporate the essential elements of this invention in a nitride-based light-emitting diode or laser diode, by incorporating the layers necessary for each respective device into the process. For instance, a p-type layer may be incorporated in order to obtain a light-emitting diode, and additionally, cladding layers may be incorporated in order to obtain a laser diode.

3. A single "feature" on the textured surface may have a wide range of dimensions. The height of a feature may vary from 0.1 microns to 2 microns, but is not limited by these values. The lateral dimensions of a "feature" may vary greatly, with at least one of the lateral dimensions falling in the range of, but not limited to, 0.1 microns to 50 microns.

Figure 5B:
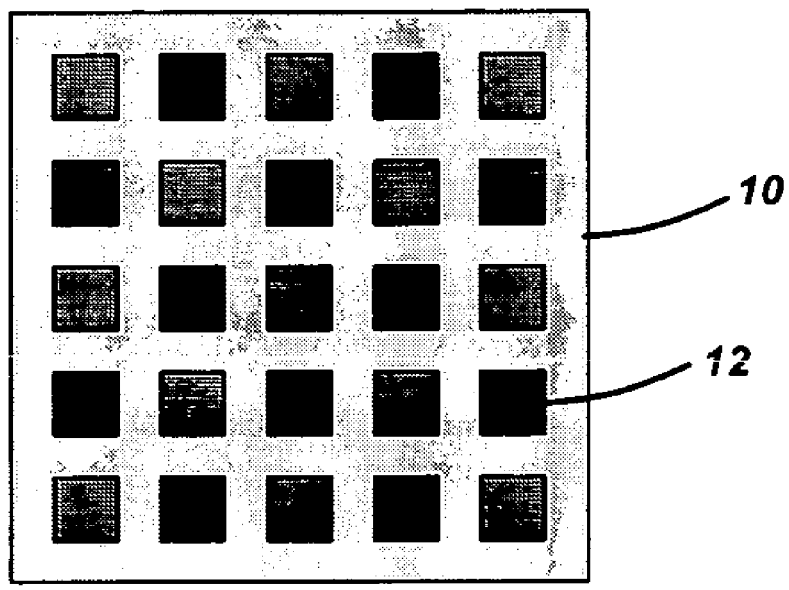

4. It is possible to envision a device with suitably textured areas that would emit at two or more peak wavelengths, where both peak emission wavelengths are produced primarily from the indium-containing light-emitting layer. For example, a device may have suitable non-textured areas, and suitable textured areas, where the texture pattern and depth is identical in all the textured areas, as shown in FIG. 5(a). This may be expected to produce two peak emission wavelengths, one each from the textured and non-textured areas. This idea may be carried forward another step in a device where the textured areas may be of two types, where the texture pattern and depth may be different in each type of textured area, as shown in FIG. 5(b). This may be expected to produce three peak emission wavelengths, one from the non-textured area, and one from each of the two textured areas. Along the same vein, devices with three or more types of textured areas, with a corresponding number of peak emission wavelengths, may be envisioned. Thus, a wide variety of light sources with multiple peak emission wavelengths arising primarily from the indium-containing light-emitting layer may be envisioned.

5. Alternative substrate materials, including but not limited to r-plane sapphire ($Al_2O_3$), c-plane silicon carbide (SiC), a-plane SiC, free-standing c-plane GaN, free-standing a-plane GaN, ELOG GaN on sapphire, AlN and SiC may be used.

6. Although the preferred embodiment deposits, or re-grows, a semiconductor material layer of identical material composition on top of the textured semiconductor layer, i.e., homo-material deposition at a textured "interface," alternative embodiments may include the deposition of a differing material composition on the textured surface.

7. Although various material layers are referred to specifically as, e.g., GaN or (In, Ga)N or (Al, In, Ga)N, the present invention is not limited to these specific compositions of material layers. Instead, the present invention is directed to the growth of light-emitting active or passive layer(s) on a patterned semiconductor layer. Therefore, the material layers may comprise other compositions, techniques and methods for fabricating light-emitting diodes used by various practitioners of the art.

For example, the light emitting layers are referred to as an indium-containing layers, in order to encompass the addition of other elements that would differ from the preferred embodiment specifically, but would be within the scope of the present invention generally.

Likewise, in the preferred embodiment, light emitting InGaN "quantum well" layers may be separated by GaN "barrier" layers. However, other compositions may be used for the barrier layers as well, including InGaN or AlGaN. Therefore, where possible, non-active material layers are referred to as nitride-based semiconductor alloys or more specifically (Al, In, Ga)N.

8. Alternative epitaxial growth techniques, including but not limited to Molecular Beam Epitaxy (MBE) may be used. Additionally, a variety of different growth conditions (precursor sources, gases, pressures, etc.) may be employed for a given growth technique.

9. Alternative techniques, including but not limited to Inductively Coupled Plasma (ICP) and Photo-electrochemical (PEC) wet etching may be used to perform the surface texturing.

10. As noted above, the order of deposition used in the preferred embodiment of the invention is as follows:
   (1) deposition of a GaN nucleation on a c-plane sapphire substrate,
   (2) deposition of a GaN:UID template layer on the nucleation layer of (1),
   (3) deposition of a Si doped n-type conductive GaN layer on the GaN:UID template layer of (2), and
   (4) patterning of the GaN layers and subsequent deposition of additional layers to complete the invention.

The purpose of these steps is to produce a high quality and electrically conductive base on which to deposit and fabricate the invention. Other methods, materials, layers, or order of deposition may be used to accomplish this requirement and subsequently realize the present invention.

In items 7, 8 and 9 above, a number of non-exclusive alternative materials, substrates and deposition techniques are listed. For each choice of material, substrate and/or deposition technique, a number of methods and layer compositions may be chosen to accomplish the requirements of these steps.

11. The texturing may be carried out to different depths, up to the thickness of the GaN layer, and may consequently yield varied results.

12. A wide variety of texture patterns may be used to texturize the growth surface, including but not limited to various arrayed or tiled arrangements of circles, squares and other polygons, and combinations thereof. A few examples of possible texture patterns are shown in FIG. 4.

13. A wide range of ratios of textured to non-textured areas over the device area may be applied, as shown in FIGS. 4 and 5, yielding varied results.

Advantages and Improvements

The advantages and improvements of the present invention over existing practice, and the features believed to be new, include the following:

1. This is believed to be the first invention calling for the light-emitting layer in a semiconductor device to be deposited on a textured surface.

2. This invention permits an indium-containing light-emitting layer containing a particular fraction of indium to be deposited under conditions that allow for higher material quality and improved efficiency. Thus, it is expected to achieve higher-quality UV to infrared light-emitting devices than are currently achievable by conventional methods.

3. A secondary effect of the surface texturing is an improvement in the light extraction efficiency.

4. By suitable placement of the indium-containing layer in the device structure, it may be used as either an "active" layer (i.e., electrically active) or as one or more "passive" layers (i.e., electrically passive).

5. By suitably designing the texture pattern to include areas with more than a single type of texture pattern, or by including non-patterned areas, a device that emits light at two or more peak wavelengths, even though the light-emitting layer is deposited in a single step, may be developed.

REFERENCES

The following references are incorporated by reference herein:

1. U.S. Pat. No. 5,779,924, to Krames, et al., issued Jul. 14, 1998, and entitled "Ordered interface texturing for a light emitting device."
2. U.S. Pat. No. 6,608,330, to Yamada, issued Aug. 19, 2003, and entitled "Light emitting device."
3. United States Patent Application Publication No. 20030057444, by Niki, Isamu; et al., published Mar. 27, 2003, and entitled "Semiconductor light emitting device."
4. U.S. Pat. No. 6,303,404, to Moon, et al., issued Oct. 16, 2001, and entitled "Method for fabricating white light emitting diode using InGaN phase separation."
5. U.S. Pat. No. 6,620,238, to Tsuda, et al., issued Sep. 16, 2003, and entitled "Nitride semiconductor structure, method for producing a nitride semiconductor structure, and light emitting device."
6. U.S. Pat. No. 6,620,643, to Koike, issued Sep. 16, 2003, and entitled "Light-emitting device using group III nitride compound semiconductor."
7. U.S. Pat. No. 6,630,691, to Mueller-Mach, et al., issued Oct. 7, 2003, and entitled "Light emitting diode device comprising a luminescent substrate that performs phosphor conversion."

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating a semiconductor light emitting device, comprising:
    depositing one or more indium-containing light emitting (Al, In, Ga)N active or passive layers directly on a textured surface of an n-type layer, wherein the indium-containing light emitting (Al, In, Ga)N active or passive layers incorporate varying fractions of indium depending on a position on the textured surface, with a higher incorporation of indium at a top of a pillar on the textured surface as compared to a lower incorporation of indium in a valley between pillars on the textured surface, thereby resulting in a spatial variation in the incorporation of indium in the indium-containing light-emitting (Al, In, Ga)N active or passive layers, such that the device comprises a phosphor-free white light source.

2. The method of claim 1, wherein the step of depositing comprises:
    (1) depositing one or more first GaN layers on a substrate;
    (2) etching the deposited first GaN layers to create the textured surface;
    (3) re-growing one or more second GaN layers on the textured surface; and
    (4) depositing the indium-containing light-emitting active or passive layers on the re-grown second GaN layers.

3. The method of claim 2, wherein the step (4) of depositing the indium-containing light-emitting active or passive layers on the re-grown second GaN layers further comprises:
    (i) depositing a quantum well layer of (Al, In, Ga)N on the re-grown second GaN layers; and
    (ii) depositing a barrier layer of (Al, In, Ga)N on the quantum well layer of (Al, In, Ga)N.

4. The method of claim 3, further comprising repeating the steps of depositing (i) and depositing (ii) to obtain a plurality of quantum well and barrier layers.

5. The method of claim 1, further comprising selectively texturing the surface.

6. The method of claim 5, wherein the textured surface is a partially textured surface.

7. The method of claim 5, further comprising controlling a ratio of a textured area of the surface to a non-textured area of the surface.

8. The method of claim 5, further comprising controlling the textured surface's pattern.

9. The method of claim 5, further comprising controlling the textured surface's dimensions.

10. The method of claim 5, wherein different patterns and depths of the textured surface produce different emission results.

11. A device manufactured according to the method of claim 1.

12. A semiconductor light emitting device, comprising:
    one or more Indium-containing light emitting (Al, In, Ga)N active or passive layers deposited directly on a textured surface of an n-type layer, wherein the Indium-containing light emitting (Al, In, Ga)N active or passive layers incorporate varying fractions of Indium depending on a position on the textured surface, with a higher incorporation of Indium at a top of a pillar on the textured surface as compared to a lower incorporation of Indium in a valley between pillars on the textured surface, thereby resulting in a spatial variation in the incorporation of Indium in the Indium-containing light-emitting (Al, In, Ga)N active or passive layers, such that the device comprises a phosphor-free white light source.

13. The device of claim 12, further comprising:
    (1) one or more first GaN layers deposited on a substrate;
    (2) the textured surface created by etching the deposited first GaN layers;
    (3) one or more second GaN layers re-grown on the textured surface; and
    (4) the indium-containing light-emitting active or passive layers deposited on the re-grown second GaN layers.

14. The device of claim 13, wherein the indium-containing light-emitting active or passive layers deposited on the re-grown second GaN layers further comprise:
    (i) a quantum well layer of (Al, In, Ga)N deposited on the re-grown second GaN layers; and
    (ii) a barrier layer of (Al, In, Ga)N deposited on the quantum well layer of (Al, In, Ga)N.

15. The device of claim 14, further comprising a plurality of quantum well and barrier layers.

16. The device of claim 12, wherein the surface is selectively textured.

17. The device of claim 16, wherein the textured surface is a partially textured surface.

18. The device of claim 16, wherein a ratio of a textured area of the surface to a non-textured area of the surface is controlled.

19. The device of claim 16, wherein the textured surface's pattern is controlled.

20. The device of claim 16, wherein the textured surface's dimensions are controlled.

21. The device of claim 16, wherein the textured surface includes different patterns and depths that produce different emission results.

22. The method of claim 1, wherein varying fractions of Indium are incorporated into the light emitting (Al, In, Ga)N active or passive layers depending on the position on the textured surface, with an intermediate incorporation of Indium in the light emitting (Al, In, Ga)N active or passive layers at a sidewall of a pillar on the textured surface.

23. The method of claim 10, wherein depths of the textured surface are at least 500 nm.

24. The device of claim 12, wherein varying fractions of Indium are incorporated into the light emitting (Al, In, Ga)N active or passive layers depending on the position on the textured surface, with an intermediate incorporation of Indium in the light emitting (Al, In, Ga)N active or passive layers at a sidewall of a pillar on the textured surface.

25. The device of claim 21, wherein depths of the textured surface are at least 500 nm.

26. The device of claim 12, wherein the spatial variation in the incorporation of indium in the indium-containing light-emitting (Al, In, Ga)N active or passive layers results in multi-wavelength emission from the indium-containing light-emitting (Al, In, Ga)N active or passive layers.

27. The method of claim 1, wherein the spatial variation in the incorporation of indium in the indium-containing light-emitting (Al, In, Ga)N active or passive layers results in multi-wavelength emission from the indium-containing light-emitting (Al, In, Ga)N active or passive layers.

* * * * *